United States Patent [19]

Yerman et al.

[11] Patent Number: 4,816,422

[45] Date of Patent: Mar. 28, 1989

[54] FABRICATION OF LARGE POWER SEMICONDUCTOR COMPOSITE BY WAFER INTERCONNECTION OF INDIVIDUAL DEVICES

[75] Inventors: Alexander J. Yerman, Scotia; Constantine A. Neugebauer, Schenectady, both of N.Y.

[73] Assignee: General Electric Company, Schenectady, N.Y.

[21] Appl. No.: 947,151

[22] Filed: Dec. 29, 1986

[51] Int. Cl.$^4$ ............................................. H01L 7/00
[52] U.S. Cl. ......................................... 437/051; 437/8; 437/173; 437/195; 437/924; 437/935; 148/DIG. 93; 148/DIG. 162; 357/75
[58] Field of Search ................. 29/593, 577 C, 577 R, 29/589; 357/74, 75, 76, 77, 80; 437/51, 8, 173, 195; 148/DIG. 93, DIG. 162

[56] References Cited

U.S. PATENT DOCUMENTS

| | | | |
|---|---|---|---|
| 3,641,661 | 2/1972 | Canning et al. | 29/593 |
| 3,702,025 | 11/1972 | Archer | 29/593 |
| 3,707,036 | 12/1972 | Okabe et al. | 29/577 |
| 3,810,301 | 5/1974 | Cook | 29/593 |
| 3,835,530 | 9/1974 | Kilby | 29/577 |
| 3,839,781 | 10/1974 | Russel | 29/577 |
| 3,897,626 | 9/1975 | Beausoleil | 29/577 |
| 3,984,860 | 10/1976 | Logue | 437/8 |
| 3,994,430 | 11/1976 | Cusano et al. | 228/122 |
| 4,034,399 | 7/1977 | Drukier et al. | 357/80 |
| 4,240,094 | 12/1980 | Mader | 437/908 |
| 4,347,306 | 8/1982 | Takeda et al. | 29/577 R |
| 4,364,044 | 12/1982 | Kusamo | 29/577 R |
| 4,414,059 | 11/1983 | Blum et al. | 156/643 |
| 4,417,948 | 11/1983 | Mayne-Bantom et al. | 156/643 |
| 4,578,697 | 3/1986 | Takemae | 357/75 |
| 4,617,085 | 10/1986 | Cole, Jr. et al. | 156/655 |
| 4,617,193 | 10/1986 | Wu | 437/195 |
| 4,639,760 | 1/1987 | Gromberg et al. | 357/74 |

OTHER PUBLICATIONS

Canning et al., "Active Memory Calls for Discretion", Electronics, Feb. 20, 67, pp. 143-154.
Charles A. Harper, "Handbook of Materials and Processes for Electronics", McGraw-Hill Book Company, New York, 1984, pp. 12-73-12-74.

Primary Examiner—Brian E. Hearn
Assistant Examiner—Beverly Ann Pawlikowski
Attorney, Agent, or Firm—Lawrence D. Cutter; James C. Davis, Jr.; Marvin Snyder

[57] ABSTRACT

A method for fabricating a composite semiconductor from a plurality of substantially identical individual semiconductor devices formed on a common semiconductor wafer includes testing the devices on the wafer to generate a positional mapping of acceptable and non-acceptable devices, dividing the wafer into a plurality of areas of arbitrary size, connecting corresponding contact pads on only the acceptable devices within a given area to each other via common conductive paths which are supported on a dielectric film covering the pads, the film having appropriately located holes filled with conductive material to electrically couple the common conductive paths and the underlying contact pads of only the acceptable devices. The devices within a given area are intercoupled in a manner to form an operational array; single or multiple arrays may be coupled together to form a composite package having common external contacts and heat sink supports.

21 Claims, 6 Drawing Sheets

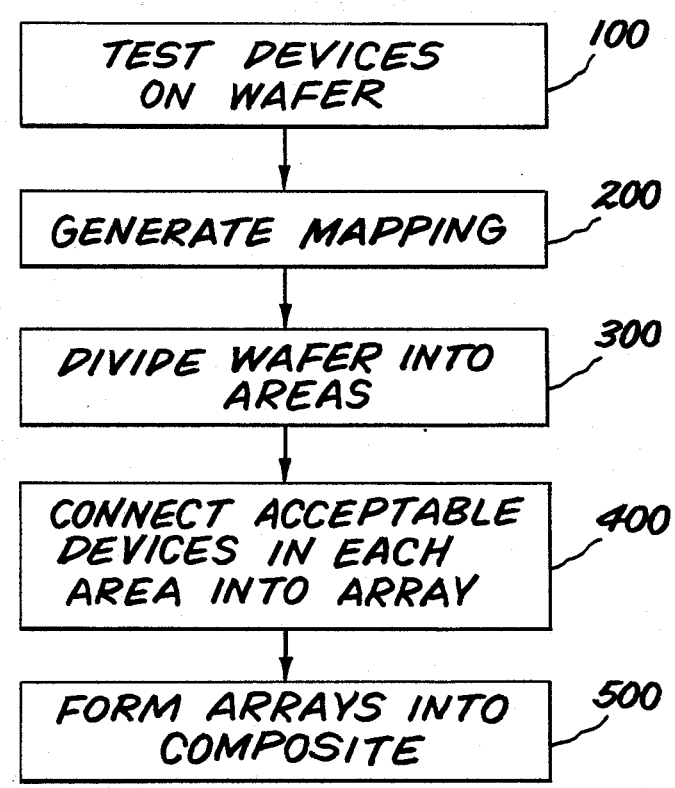

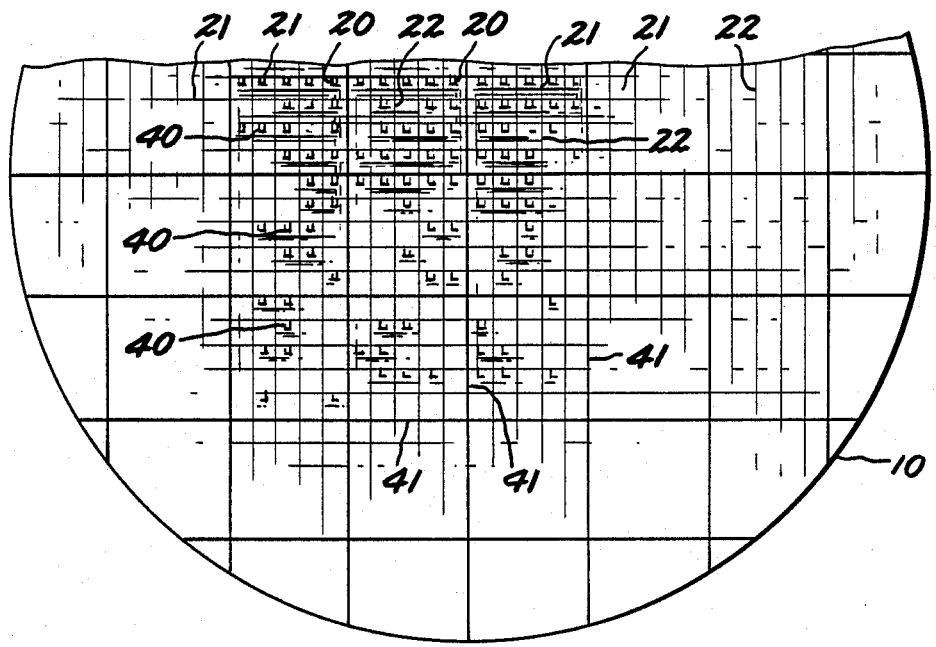
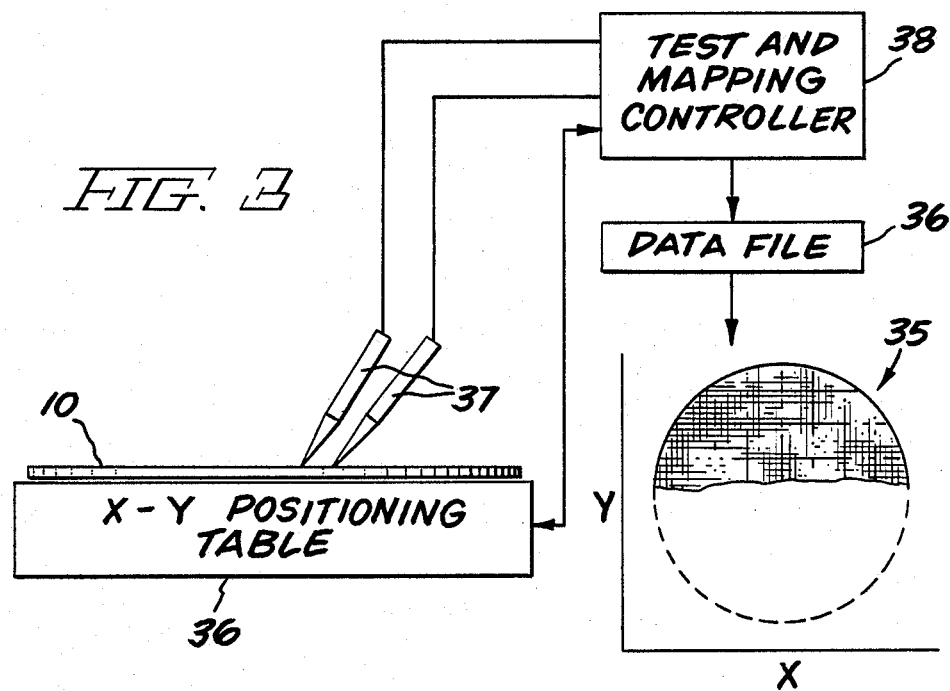

FABRICATION OF LARGE POWER SEMICONDUCTOR COMPOSITE BY WAFER INTERCONNECTION OF INDIVIDUAL DEVICES

BACKGROUND OF THE INVENTION

This application is directed to a method for fabricating a composite semiconductor device from a plurality of substantially identical component semiconductor devices and to a resulting new composite structure. More specifically, it is directed to a method for making a relatively high power metal oxide semiconductor (MOS) device from a plurality of identical relatively lower power MOS devices.

Over the last several years, the overall size of semiconductor chips has increased to about 0.6 cm. on a side. Within this size range, increased functionality has been achieved primarily by reducing feature size. The principal reason for this chip size limitation is that process induced defects reduce chip yields significantly as chip size increases. It has been estimated that, as a result of this yield reduction, the cost of larger chips increases as a function of the fourth power of chip size.

For power switching applications, it is highly desirable to be able to handle larger currents and higher voltages with lower internal power dissipation. All of these objectives tend to require a larger chip size. Since chip size is limited from a cost vs. yield standpoint as noted above, it would be desirable to provide a method for cost effectively coupling together many small conventionally sized devices into a composite package which achieves these operational objectives. Current techniques for achieving this paralleling of many relatively small individual devices to form such a composite complex are complex and costly.

OBJECTS AND SUMMARY OF THE INVENTION

A primary objective of the invention is therefore to provide a method for forming a composite semiconductor from semiconductor devices formed on a single wafer and differentiating the unacceptable devices on the wafer from those which are acceptable from an operational or other standpoint. The wafer is then divided into a plurality of separate areas, each area containing a plurality of adjacent devices, some of the areas including both acceptable and non-acceptable devices. While the areas of the wafer may be designated prior to testing, it is preferable to do so after testing in order to maximize the yield. Only the acceptable devices in each area are coupled together in parallel to form a parallel array by a process which involves overcoating the device contact pads on one face of the array with a suitable insulating coating, selectively forming openings through the insulating coating only to the pads of the acceptable devices, depositing a metallization layer over the coating and through the openings to contact the pads of acceptable devices. The metallization layer is then patterned to form separate conductive runs, one for each set of similar contact pads on the devices, each set of contact pads corresponding to a different active semiconductor region of each device. For MOSFET devices separate conductive runs making contact respectively to the source and gate active areas on acceptable devices would be made. The array thus formed is further processed to provide a common electrical connection or contact to each of the separate conductive runs as well as to any additional common terminal for operation of the device. Then, depending on the desired power rating of a composite device to be formed, a preselected number of arrays are coupled in parallel to form a mosaic which includes a ceramic heat sink for each array forming the composite.

BRIEF DESCRIPTION OF THE DRAWINGS

In order to clearly understand the invention, it will now be described in greater detail with reference to the accompanying drawings, wherein:

FIG. 1 is a flowchart illustrating the general steps in the method of the invention;

FIG. 2 illustrates a semiconductor wafer with individual semiconductor chips or devices formed thereon, the wafer shown as divided into a plurality of areas (defined by dark grid lines), each area containing a plurality of adjacent chips to be interconnected into an array in accordance with the invention;

FIG. 3 illustrates the preferred method for testing each device on a wafer to generate a positional mapping of acceptable and non-acceptable devices;

DETAILED DESCRIPTION OF THE INVENTION

Figure 4:
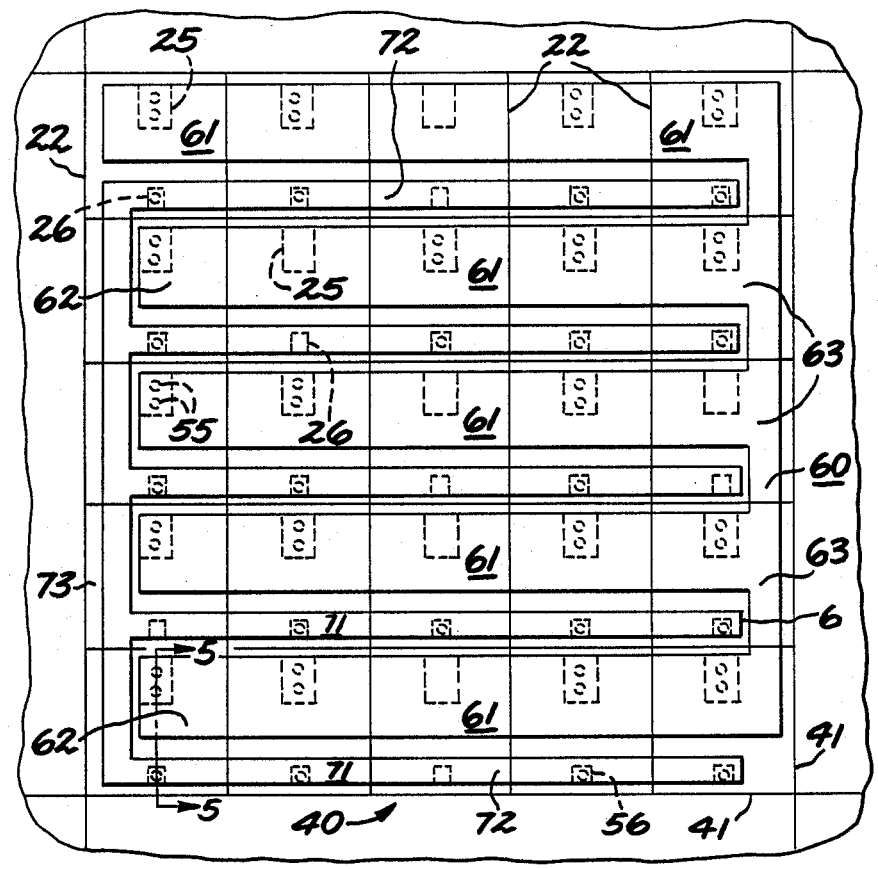
FIG. 4 is a more detailed view of one of the arrays on the wafer of FIG. 2 prior to incorporation into a composite device according to the invention.

As a background to understanding the proces of the invention, a brief description will be given with reference to FIGS. 2, 4 and 5 of a conventional fabricated semiconductor wafer to which the process will be applied. Referring to FIG. 2, there is illustrated a portion of a typical semiconductor wafer 10 comprising a plurality of individual semiconductor devices 20, in the illustrated example, a plurality of metal oxide semiconductor field effect transistors (MOSFETS) 20. Each individual MOSFET 20 is located within a square shaped zone 21 defined by light grid lines 22 in FIGS. 2 and 4, it being understood that the light grid lines 22 are shown only for ease of illustration and do not appear on the wafer itself. It is understood that the MOSFET devices 20 are formed throughout substantially the entire wafer 10 notwithstanding that only a small fraction are shown in FIG. 2, for ease of illustration. Referring to FIG. 5, each of the MOSFET devices 20 is formed in a processed silicon substrate 27 in a conventional manner and comprises a first contact pad 25 overlying a first active semiconductor region within the substrate 27, commonly designated as the source, and a second contact pad 26 overlying a second active semiconductor region within the substrate 27, commonly designated as the gate. The source and gate pads 25 and 26 are shown as being located on the upper planar surface of the substrate 27, while a third contact pad 30 is located adjacent a third active semiconductor region within the substrate 27, commonly designated as the drain, and located on the lower planar surface of substrate 27. The pads 25, 26 and 30 are usually made of aluminum. It should be borne in mind that while FIG. 5 illustrates only conductive pads 25, 26 and 30 as part of the underlying structure of the semiconductor substrate 27, in reality, the substrate and pads actually are generally a part of a much more complicated structure.

As is well known in the art, the yield from conventional processes for fabricating MOSFETS (and other types of devices) is considerably less than 100%. Thus, on a typical wafer, a significant number of semiconductor devices 20 will be unacceptable for one reason or another, and some means must be provided for identifying and eliminating such unacceptable devices.

The method of the invention will now be generally described with reference to FIG. 1 wherein there is shown a flowchart which describes the overall process according to the invention. Starting with a previously fabricated semiconductor wafer 10 which comprises a plurality of substantially identical semiconductor power devices, as generally shown and described with reference in FIGS. 2, 4 and 5, the first step, step 100, in the process according to the invention is to test the individual devices on the wafer 10 by means of an apparatus to be described below in order to determine whether or not each device is acceptable or non-acceptable from an operational standpoint. The next step, step 200, is to generate an X-Y grid positional mapping which locates the acceptable and nonacceptable devices on the wafer 10. More specifically, since the yield of any conventional fabrication process is less than 100%, there will inevitably be located on the wafer 10 a number of unacceptable devices. Since a composite device which incorporates non-functioning individual devices will not operate properly, the individual semiconductor devices 20 on the wafer 10 must be tested and a procedure put in place for omitting such nonacceptable devices from the resultant composite. In order to accomplish this, there is provided a method and means for testing at least certain individual characteristics of each of the devices on the wafer to determine whether each of such devices is either acceptable, i.e., meets preselected operational or other parameters, or nonacceptable, i.e., falls below preselected operational or other standards. Any number of characteristics of the tested device may be sufficient to categorize it as nonacceptable and such standards will be left to the ultimate discretion of the fabricator in keeping with the desired characteristics of the composite. Irrespective of the standards chosen, the methodology for testing each of the individual devices on the wafer must include the ability to generate a positional mapping, i.e., a grid or equivalent mapping, which permits the differentiation and delineation of the nonacceptable devices from those which are acceptable.

The next step, step 300, in the methodology of the invention is to divide the overall wafer into a plurality of areas, each area containing a plurality of adjacent individual semiconductor devices. These areas may be designated either prior to or after testing, however, it is preferable to do so afterward in order to maximize the utilization of acceptable devices, as will become clear hereinafter, in the formation of the composite. The areas are illustrated in FIG. 2 as being bounded by the dark grid lines on the semiconductor wafer and may be selected without reference to whether devices contained therein are acceptable or nonacceptable. For this reason, each area will, in all likelihood, contain a number of unacceptable devices as well as a majority (depending upon the yield) of acceptable devices.

Having divided the wafer into a plurality of distinct areas, each of which contains a plurality of acceptable and nonacceptable devices, the acceptable individual devices in each area are coupled together into an operational array, step 400, the details of which will be described below. More specifically, based on the earlier determined X-Y positional mapping of acceptable and non-acceptable devices, each array is formed by connecting in parallel only those devices in a given area which have been designated as meeting acceptable standards. The non-acceptable devices are, in effect, disconnected from the operational array.

In the final step, step 500 of the process, an array or plurality of arrays is provided with the required heat sinking and terminal arrangements to form it into a composite package. The number of arrays coupled together to form the composite is essentially dictated by the desired power rating of the composite.

For the purpose of identifying non-acceptable devices on the wafer in accordance with step 100, FIG. 1, there is illustrated in FIG. 3 the essential parts of an arrangement whereby the wafer 10 may be explored in order to determine the acceptable from the non-acceptable devices. For this purpose there is provided an X-Y positioning table 36 on which the wafer 10 is placed so that the wafer may be moved under the control of a test and mapping controller 38 in a manner such that a suitable set of probes 37 or other suitable testing device may investigate its surface, specifically, each MOSFET 20 contained on the wafer 10. The results of such testing are analyzed by the controller 38 to generate data file 36 comprising a positional X-Y mapping which delineates the acceptable devices from the nonacceptable devices. While the data file 36 is typically in the form of an array of values stored in the computer memory or on a suitable storage medium for later use in the process, as will be described hereinafter, a visual or graphical mapping 35 may also be generated. One piece of equipment which may be used to accomplish the above noted testing purpose is manufactured by Eaton Corp. as their "Impact II Automated Discrete Semiconductor Test System" with a Teledyne-PAC PR-100 probe station. This system permits the mounting of a wafer on a translatable table while probes on the equipment sequentially interrogate each of the individual devices on the wafer to determine whether or not such device is acceptable in accordance with defined standards programmed into the testing equipment and to generate a software data file 36 of the results.

Having generated a computer data file 36 and X-Y mapping 35 which identifies acceptable and non-acceptable devices on the wafer, the wafer is divided into individual areas 40, the areas 40 being bounded by relatively heavy grid lines 41 in FIG. 2. As indicated, the areas 40 each contain a plurality of adjacent devices 20, each device illustrated in FIG. 2 as being located in the smaller zones 21 outlined by the relatively lighter grid lines 22. The size of the area 40 and the number of devices 20 within each such area is determined based on the electrical rating of the individual devices 20 and the desired rating of the resultant composite packages to be fabricated. For example, if each device is rated at 1 amp and a 25–30 amp composite device is considered commercially appropriate, a 5×5 device area 40 (as shown in FIG. 2) would be a reasonable choice.

In order to proceed to interconnect the acceptable chips in a given area into an operative array in accordance with step 400, FIG. 1, a dielectric film 45 (FIG. 5) such as is deposited over the entire wafer covering the conductive pads 25 and 26 on the upper surface of the substrate 27 (FIG. 5). The film 45 will serve as a base on which a patterned conductive layer to electrically interconnect the acceptable devices in the array will be deposited, as described below.

Figure 8:
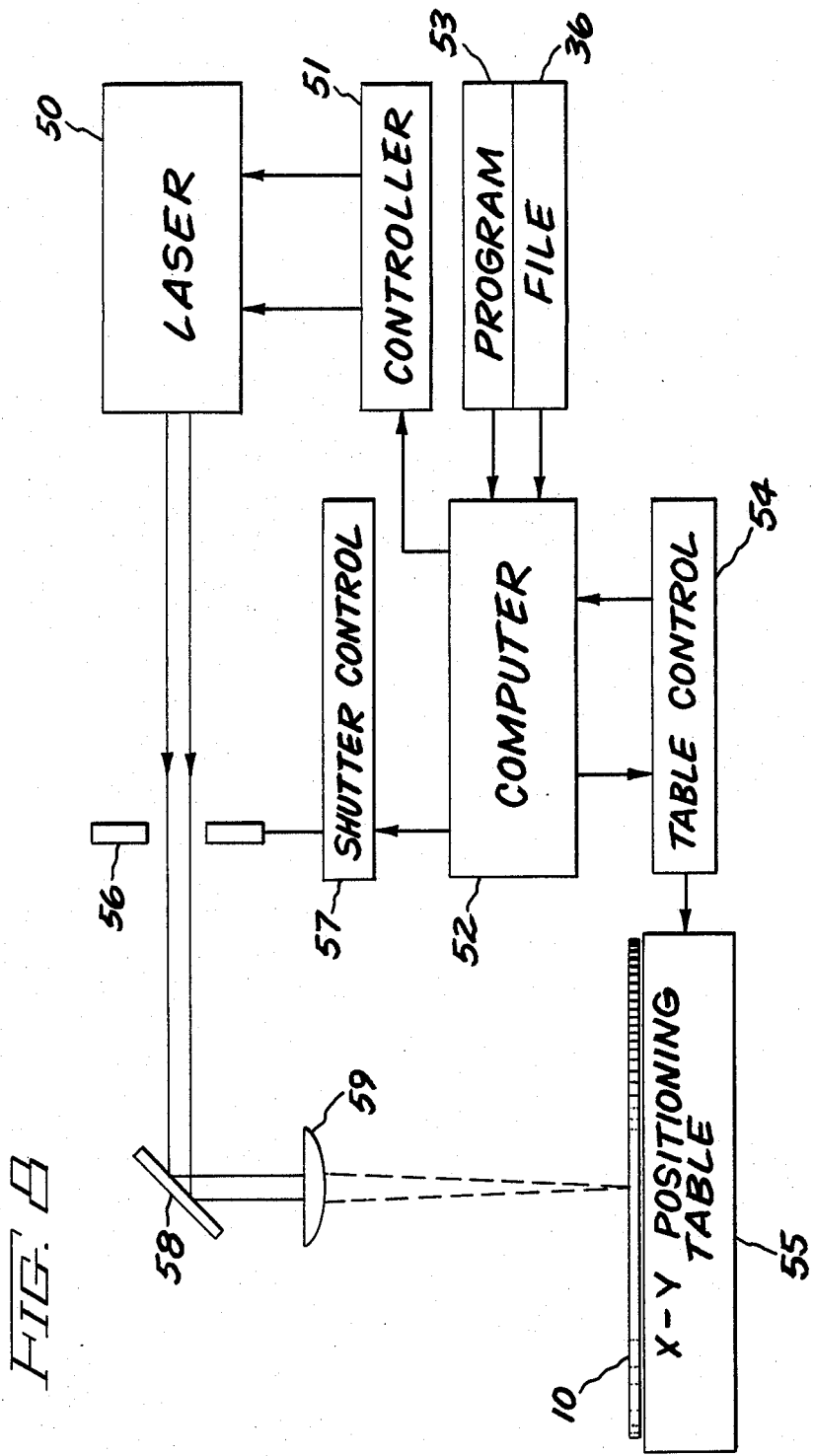
FIG. 8 is an illustration of an arrangement for forming via openings through the dielectric layer only to the contact pads of acceptable chips in an array in accordance with a previously generated mapping.

In order to create openings through the dielectric film 45 which connect with the pads 25 and 26 of the acceptable chips, an arrangement similar to that shown in FIG. 8 is used. Referring to FIG. 8, there is shown a laser 50 and a laser controller 51 to control the light output pulses from the laser 50 under the control of a computer 52. The computer 52 is loaded with a suitable software package 53 and the data file 36 generated as a result of the previously described testing procedure (FIG. 3), which identifies the location of the acceptable chips on the wafer 10. The computer 52 also controls a table control 54 which operates to move the X-Y table 55 in a prescribed manner to bring each chip on the wafer 10 into the focussing zone of the light from the laser 50.

As the table is moved, different chips in the areas 40 on wafer 10 are positioned to intercept light energy emitted from laser 50 and focussed onto the surface of the film 45 by a corner reflector 58 and lens 59.

In this manner, as the table 36 is positioned to move a particular chip under the focussed laser beam a query is made by the computer 52 of the data file 36. If the chip is found to be acceptable by virtue of the mapping two holes 55, FIGS. 4 and 5, are made through the film 45 overlying the source pad 25, and one hole 56 is made through the film 45 overlying the gate pad 26. Alternatively, if a chip which is known to be unacceptable is positioned under the laser beam, no holes are made in the dielectric film at those corresponding points. FIG. 4 illustrates six chips as being unacceptable and having no holes created to their associated contact pads. The showing of two holes 55 for the source contact is primarily to allow a better differentiation between the source and gate holes in the drawings. The number of holes overlying a given contact pad is a matter of discretion depending in part on the size of the holes made by the process chosen, the current to be carried by the source region, etc.

In addition, while the holes in film 45 are shown in the drawings as being cylinders, in actuality such precise shapes are seldom possible and irregular shapes are to be assumed. The important feature is that an opening of appropriate size and shape to allow subsequent filling with a conductive material is possible.

The holes are made in the film 45 by opening and closing an aperture mechanism 56 (FIG. 8) in the path of the laser beam and under the control of a shutter control 57 which, in turn, is controlled by signals from the computer 52.

It should also be understood that the detailed technique for making openings 55 and 60 in the dielectric film 45 is discretionary and does not form a part of this invention. For this purpose, the techniques described in U.S. Pat. No. 4,617,085 in which a pulsed laser is energized to generate openings in a dielectric film may be utilized. A wavelength of approximately 248 nanometers has been found to provide good results. Alternatively, the technique of copending and commonly assigned U.S. patent application Ser. No. 912,455, filed on Sept. 26, 1986, in the names of Robert J. Wojnarowski and Charles W. Eichelberger, entitled "Method to Produce Via Holes in Polymer Dielectrics for Multiple Electronic Circuit Chip Packaging", may also be employed to make openings in the dielectric film. Depending upon the drilling technique chosen, the dielectric film, the laser, and drilling technique would be chosen to complement each other as described in the above-noted references.

If the process of the above noted patent is chosen to make the openings in the dielectric film, a single step ablation of an opening through the film 45 is made. If the technique of the copending application is employed the laser is used in a two step process in which the first step is to sensitize the dielectric film 45 by use of the laser impinging on the appropriate areas, followed by an etching operation in which the openings are made by use of an appropriate reactive etching. In either event, once this step is completed, appropriate openings will have been made through the dielectric film 45 which permit electrical connections to be made to the gate and source electrodes 26 and 25 of the good power chips in each of the designated areas 40 on the wafer 10.

Having formed the openings 55 and 56 as discussed above, the next step in the process is to evaporate a continuous conducting metal film 60 over the surface of the wafer and overlying the insulating film 45. The conducting metal film thus evaporated contacts the source and gate electrodes of each of the acceptable devices on the wafer where the dielectric film has been removed by filling of the openings 55 and 56 (FIG. 5), making electrical contact between the electrodes 25 and 26 and the metal film 60. A typical film 60 would consist of 300–500 Angstroms of Cr overcoated with one micron or more of copper. If thicker metal is desired, it could be applied at this stage by electroplating, but for many applications, the above-noted initial metal layers applied by evaporation or sputtering in high vacuum would suffice.

At this stage in the process there is provided a single continuous conductive layer 60 overlying the dielectric film 45 which electrically couples or shorts together all of the pads 25 and 26 on the wafer 10. This conductive layer must be patterned firstly to provide separate islands in each area 40 which are electrically insulated from each other. This is accomplished by dividing the layer 60 along the grid lines 41 which separate the various areas 40. Secondly, the islands thus formed from conductive layer 60 must be patterned in each area 40 into individual conductive runs, one of which contacts only all of the source pads 25, and the other which contacts only all of the gate pads 26. This is accomplished by dividing the continuous conductive pattern 60 in each area 40 into a first run 61 which contacts only the source pads 25. The run 61 (FIG. 4) is seen to comprise a series of fingers 62 which connect with each of the source pads 25, the fingers 62 being coupled together by a base run 63. In a similar manner, a second conductive run 71 is provided which includes fingers 72 which serve to interconnect each of the gate pads 26, the fingers 72 being coupled together by a base run 73 located opposite to the base run 63. The fingers 62 and 72 are seen to form an interdigitated assembly in each of the areas 40 which provides separate electrical connections to the source and gate pads.

The above noted patterning of the initially deposited continuous film 60 into islands corresponding to each area 40 and into separate runs 61 and 71 is accomplished as follows. Briefly, a photoresist layer (not shown) is applied to the surface of the metal film 60, and patterned photolithographically to provide the two interdigitated runs 61 and 71 shown in FIG. 4. In addition, the fixed cellular mask would provide for the removal of metal film in the scribe lane areas (corresponding to the lines 41) where chip array separation is accomplished by later employing a dicing saw or similar technique. The above patterning of the metal film 60 is considered to be completely conventional.

Figure 5:
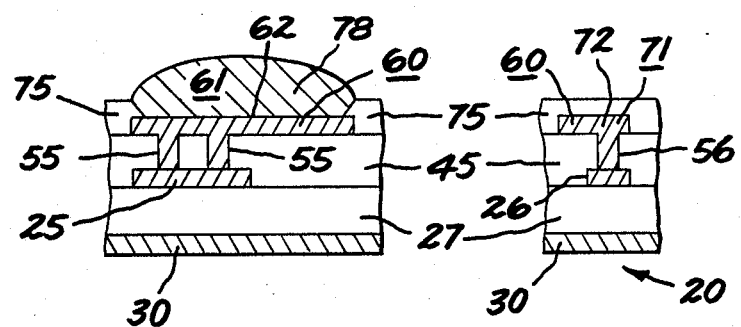
FIG. 5 is an enlarged cross-sectional view along the lines 5—5 of FIG. 4 showing in greater detail one of the semiconductor devices on the wafer.

At this stage of the process the upper surface of the wafer in each of the areas 40 includes two interdigitated conductive runs 61 and 71, as shown in FIG. 4. For ease of later assembly, it is desirable to provide a single small area contact as an electrical connection to the gate run 71 since the current carried by the gate during normal operation of the resultant device is very small. On the other hand, since current carried by the source run is relatively large, a larger area contact is desirable as an electrical connection during normal operation. For this purpose and for the additional purpose of keeping the gate and source electrodes electrically insulated from each other during subsequent processing, a second layer of polyimide 75 (FIGS. 5 and 6) is applied over the patterned conductive runs 61 and 62 using the same procedure as before, except this layer is not imidized, but only heated sufficiently to remove the bulk of the solvent. By applying a positive photoresist (not shown) over it, and exposing through a second fixed mask, this second polyimide layer 75 is etched away by a positive photoresist developer to leave the second polyimide layer 75 completely covering the gate run 71, except in a small central area 76, FIG. 6, on the periphery of each area 40 and leaving the source run 61 completely exposed from above. The positive photoresist process is conventionally used in patterning polyimides and, therefore, no additional details are deemed necessary here.

Figure 6:
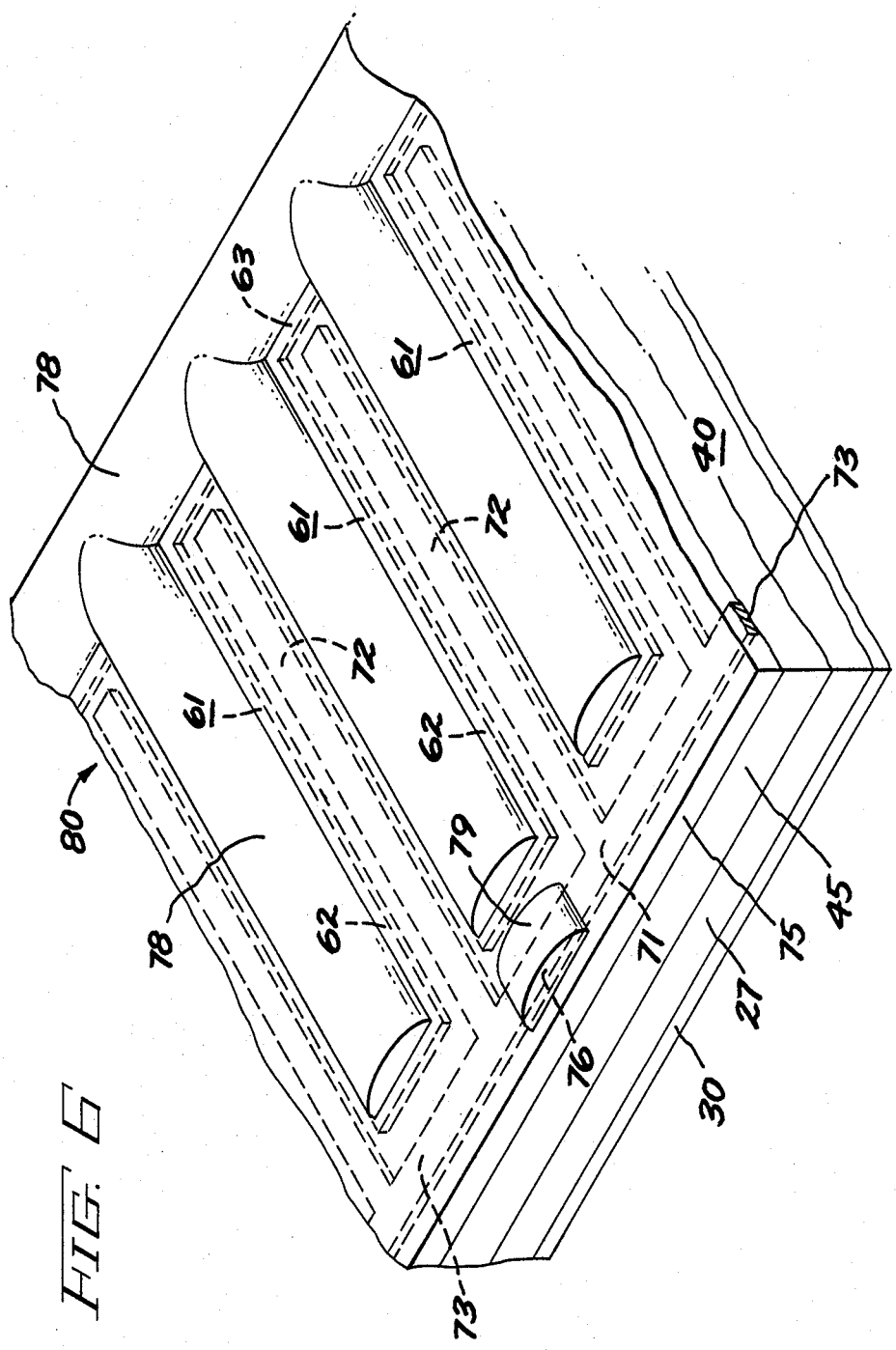
FIG. 6 is a perspective view of a portion of an interconnected array of chips prior to assembly onto a heat sink mounting.

Following this patterning step, the polyimide layer 75 is cured by heating and has the general shape as shown in FIG. 6, i.e., with the source run exposed and open from above and with the gate run 71 covered with polyimide except for the small area 76. Other conventional techniques for patterning polyimides may be employed.

After the polyimide layer 75 is patterned and cured, a conventional solder process is employed to provide external contact surfaces 78 and 76 to the source and gate electrodes, respectively, in each area 40 (FIG. 6).

At this stage, the wafer 10 is severed along the scribe lines 41 to provide a plurality of arrays 80, FIG. 6, approximately 0.5 inches on a side, each of which contains a 5×5 array of the smaller chips with only the good chips interconnected. Each array 80 corresponds to an area 40 but it should be kept in mind that FIG. 6 shows only a central portion of one array 80. These arrays 80, now have a solderable source contact 78 which extends over much of the array surface and a solderable gate contact 79 at the array edge.

This completes the process described in FIG. 1 through step 400; it remains for the formed arrays 40 to be connected into composite devices which provide desired power rating characteristics. That portion of the process will now be described with reference to FIG. 7.

Figure 7:
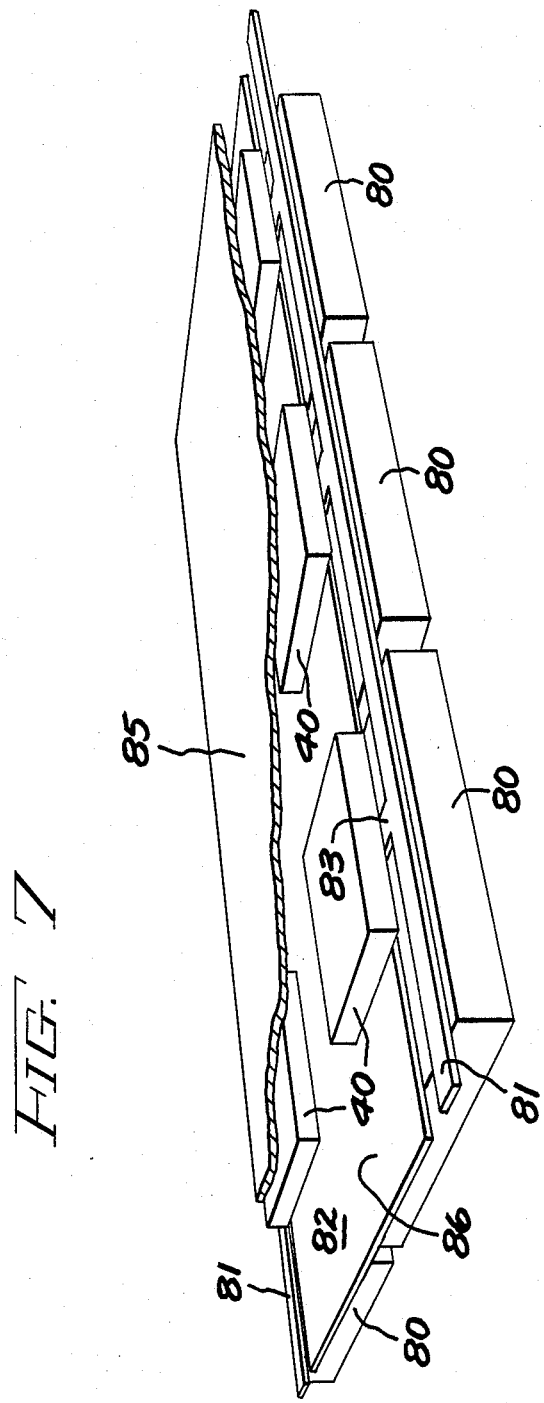
FIG. 7 is a view showing the assembly of a plurality of arrays to form a composite device according to the invention.

In order to assemble the prefabricated arrays 40 into a higher powered composite package, a second tier of assembly is utilized. Referring to FIG. 7, a heat sink support is first made by direct bonding a thin foil of copper or copper surfaced metal 82 to a series of individual dielectric ceramic blocks 80. The continuous foil 82 is first bonded to the blocks 80 by the procedure set forth in the patents of Burgess et al. (U.S. Pat. No. 3,744,120), Babcock et al. (U.S. Pat. No. 3,766,634), Burgess et al. (U.S. Pat. No. 3,854,892), Burgess et al. (U.S. Pat. No. 3,854,892), Burgess et al. (U.S. Pat. No. 3,911,553), Cusano et al. (U.S. Pat. No. 3,994,430) and Cusano et al. (U.S. Pat. No. 4,129,243). The copper foil 82 when bonded to the blocks 88 serves to bind the blocks together to form a unitary assembly. Prior to or after bonding, the foil 82 is chemically etched in a conventional manner, to form electrically separate patterns 81 and 86. The layer 81 is patterned to make electrical contact with the gate electrodes of all the chips in a given array 40 or several arrays 40 via the gate solder contact 76 which is located on the periphery of each array. For this purpose, the layer 81 includes a finger projection 83 patterned as shown. In the arrangement shown in FIG. 7, two similarly shaped copper foil patterns 81 are provided to make electrical contact with the gate electrodes of different, but adjacently located arrays 40 on opposite sides of the copper foil 82.

In a similar fashion, a second but larger area rectangular copper pattern 86 is provided for coupling to the source electrodes of the arrays 40 via the large area source solder contacts 78 (FIG. 6).

The arrays 40 may then be flip-chip mounted by any suitable technique, such as soldering to the preassembled mosaic heat sink support assembly. As a result of the mounting process, the gate solder finger 76 is electrically coupled to foil pattern 81 and the source solder surface 78 is electrically coupled to the patterned layer 86. Once the arrays 40 have been mounted to the heat sink support, the arrays may be tested individually or collectively by applying a temporary contact to the exposed drain contact on the top of the assembly. This test is used to insure that all mounted chips are still fully functional. If some are not, they can readily be cut out at this stage by cutting the copper foil bridges which join the mosaic of ceramic pieces. In general, however, one would expect to have a very high yield at the end of this mounting operation. Following this test, a permanent drain contact would be created by soldering the copper pattern 85 to the common drain electrodes 30 on each of the arrays 80.

One particular advantage of the two tier mosaic is that the arrays 40 are separated far enough apart that, in operation, heat spreading results in lower thermal resistance. At the same time, the ceramic mosaic provides ground insulation for the entire array. Typically, the exposed surfaces of the ceramic blocks would also be metallized so that the entire array could be solder mounted to a heat sink. By employing a heat sink in the form of a ceramic mosaic instead of a single large piece, benefits accrue in the form of longer thermal fatique life, and a significant reduction in the cost of the ceramic, if BeO is used.

While the preferred dielectric film 45 comprises a polyimide-siloxane varnish such as GE tye SPI-1000 applied by spin coating the film 45 may comprise any suitable polymer such as UITEM TM polymer resin (as sold by General Electric Company) polysulfone, XYDAR TM (as sold by the Dart Company) polyimide, or MYLAR TM plastic (as sold by Dupont deNemours Co., Inc.) epoxy.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A method for fabricating a composite semiconductor package from a plurality of individual semiconductor devices formed on a common semiconductor wafer, said method comprising the steps of:

testing each device to generate an electronically stored positional mapping of acceptable and non-acceptable devices on said wafer;

dividing said wafer into a plurality of areas, each area containing a preselected number of adjacent devices, and each area also having an individual pattern of acceptable and non-acceptable devices;

connecting corresponding contact pads on each of the acceptable devices in a given area to each other by means of separate common conductive paths to form an array in each of said plurality of areas in accordance with said individual patterns of acceptable and non-acceptable devices on said wafer as specified by said stored positional mapping;

severing said wafer into a plurality of separate arrays as specified by said aforementioned division of said wafer into a plurality of areas;

coupling together, in electrical parallel, the common conductive paths of a plurality of said severed arrays to form said composite package.

2. The method of claim 1 wherein said step of connecting corresponding contact pads on each of said acceptable devices in a given array to each other is accomplished by:

overcoating said wafer with an insulating layer;

forming openings through said layer to only the contact pads associated with acceptable devices on said wafer; and depositing a conductive coating on said insulating layer, which coating fills said openings and makes electrical contact with said contact pads.

3. The method of claim 2 further including the steps of:

patterning said conductive coating to form separate conductive strips insulated from each other, one of said strips forming a first common conductive path electrically interconnecting a first set of corresponding contact pads, and another of said strips forming a second common conductive path electrically interconnecting a second set of corresponding contact pads.

4. The method of claim 3 further including the steps of:

providing a ceramic support substrate, forming separate conductive layers on said substrate;

bringing said conductive strips on said array into contact with different ones of said layers on said substrate.

5. The method of claim 4 wherein said step of depositing comprises direct bonding a patterned copper containing layer onto said substrate.

6. The method of claim 2 wherein said insulating layer is a polymer.

7. The method of claim 6 wherein said polymer is selected from the group consisting of polysulfone, polyimide or epoxy.

8. The method of claim 2 wherein the step of forming openings comprises focussing electromagnetic eneregy on the surface of the layer where said opening is desired.

9. The method of claim 8 wherein said electromagnetic energy is produced by a laser.

10. The method of claim 8 wherein said laser is operated at a frequency of approximately 248 nanometers.

11. The method recited in claim 9 wherein the energy from said laser is applied to said layer in a pulsed manner.

12. The method of claim 4 wherein said ceramic substrate is Berylia oxide or aluminum nitride.

13. A method of forming a composite semiconductor device from a plurality of individual devices formed on a semiconductor wafer, said method comprising the steps of:

(1) testing said devices on said wafer in order to generate an electronically stored positional mapping of acceptable and non-acceptable devices;

(2) forming a plurality of adjacent devices into an area, each area having an individual pattern of acceptable and non-acceptable devices; and (3) using said electronically stored mapping as a guide to connect only the acceptable devices in said area in parallel to form an array in accordance with individual patterns of acceptable and non-acceptable devices as specified by said electronically stored positional mapping, said array having a common electrical connection for each set of corresponding contact pads on each of said acceptable devices.

14. The method of claim 13 wherein said step of using said mapping to connect only the acceptable devices comprises the steps of:

overcoating the contact pads of both said acceptable and non-acceptable devices with an insulating layer;

forming openings through said insulating layer only to the contact pads of said acceptable devices;

depositing a uniform metallization coating over said insulating layer to provide a conduction layer which makes contact with the contact pads of said acceptable devices via said openings; and patterning said metallization coating to divide it into separate conductive runs, one run for each set of corresponding contact pads.

15. The method of claim 14 further including the steps of:

connecting together in parallel a plurality of arrays to form a composite power device.

16. The method of claim 14 wherein said insulating layer is a polymer.

17. The method of claim 16 wherein said polymer is selected from the group consisting of polysulfone, polyimide or epoxy.

18. The method of claim 14 wherein the step of forming openings comprises focussing electromagnetic energy on the surface of a layer where said opening is desired.

19. The method of claim 18 wherein said electromagnetic energy is produced by a laser.

20. The method of claim 18 wherein said laser is operated at a frequency of approximately 248 nanometers.

21. The method recited in claim 20 wherein the energy from said laser is applied to said layer in a pulsed manner.

* * * * *

Disclaimer

4,816,422.—*Alexander J. Yerman*, Scotia; *Constantine A. Neugebauer*, Schenectady, both of N.Y. FABRICATION OF LARGE POWER SEMICONDUCTOR COMPOSITE BY WAFER INTERCONNECTION OF INDIVIDUAL DEVICES. Patent dated Mar. 28, 1989. Disclaimer filed Oct. 30, 1989, by the assignee, General Electric Company.

Hereby enters this disclaimer to claims 2 - 12 and 14 - 21 of said patent.
[ *Official Gazette January 30, 1990* ]